United States Patent [19]
Sato et al.

[11] Patent Number: 5,536,981
[45] Date of Patent: Jul. 16, 1996

[54] CIRCUIT CARD MOUNTING SHELF APPARATUS HAVING AUTOMATIC IDENTIFICATION NUMBER SETTING FUNCTION

[75] Inventors: Kazuyuki Sato; Satoshi Nagata; Kenji Otaki, all of Kawasaki, Japan

[73] Assignee: Fujitsu Limited, Kanagawa, Japan

[21] Appl. No.: 482,743

[22] Filed: Jun. 7, 1995

Related U.S. Application Data

[63] Continuation of Ser. No. 23,329, Feb. 26, 1993, abandoned.

[30] Foreign Application Priority Data

Feb. 27, 1992 [JP] Japan ..................... 4-041238

[51] Int. Cl.$^6$ ..................... H04Q 1/00
[52] U.S. Cl. ..................... 307/116; 340/825.52; 361/785; 361/788
[58] Field of Search ..................... 361/785, 788; 307/116; 340/825.49, 825.52

[56] References Cited

U.S. PATENT DOCUMENTS 4,626,846 12/1986 Parker et al. ..................... 340/825.52

*Primary Examiner*—William M. Shoop, Jr.
*Assistant Examiner*—Peter Ganjoo

[57] ABSTRACT

A circuit card mounting shelf apparatus having an automatic identification number setting function by which the identification number of a circuit card can be set automatically without the necessity of an artificial operation while maintaining the universality of the shelf apparatus which is realized with conventional apparatus. The circuit card mounting shelf apparatus comprises a plurality of circuit cards having respective identification number setting connectors mounted thereon which are different from one another, and a shelf having a back board for mounting the circuit cards thereon. A plurality of wiring lines for interconnecting the identification number setting connectors of the circuit cards are formed on the back board and cooperate with the identification number setting connectors to automatically set identification numbers of the circuit cards.

11 Claims, 8 Drawing Sheets

CIRCUIT CARD MOUNTING SHELF APPARATUS HAVING AUTOMATIC IDENTIFICATION NUMBER SETTING FUNCTION

This is a continuation of application Ser. No. 08/023,329, filed Feb. 26, 1993 abandoned.

BACKGROUND OF THE INVENTION

This invention relates to a shelf apparatus for mounting a circuit card thereon.

A shelf apparatus for mounting a circuit card has a kind of frame structure and is used in such a manner that a suitable number of modularized circuits such as a CPU circuit or a memory circuit are inserted parallelly into the shelf apparatus to construct a desired calculating apparatus, for example, for a computer.

Circuit cards for use with a shelf apparatus normally include various input/output apparatus for a disk apparatus, a magnetic tape apparatus, a semiconductor memory apparatus and so forth.

Circuit cards are individually formed to achieve different functions and are selectively loaded into and unloaded from a shelf apparatus so that various types of calculating apparatus having different functions may be constructed with the single shelf apparatus.

Conventional shelf apparatus are described in more detail below with reference to FIGS. 7 to 10. FIG. 7 shows an exemplary one of conventional circuit card mounting shelf apparatus; FIG. 8 shows an interface card for use with the circuit card mounting shelf apparatus; FIG. 9 shows an apparatus circuit card for use with the circuit card mounting shelf apparatus; and FIG. 10 shows an apparatus controlling circuit card for use with the circuit card mounting shelf apparatus. The conventional circuit card mounting shelf apparatus shown includes a basic shelf apparatus 1 which is in the form of a frame structure having a parallelepiped profile and is adapted to mount suitable circuit cards thereon to construct a desired calculating apparatus section.

The circuit card mounting shelf apparatus further includes an extension shelf apparatus 2 which also is in the form of a frame structure having a parallelepiped profile and is adapted to mount suitable extension circuit cards thereon to construct a desired extension calculating apparatus section.

Several circuit cards are mounted on the circuit card mounting shelf apparatus shown in FIG. 7. The circuit cards include an apparatus controlling circuit card 3, a circuit card 4 for an apparatus #0, a circuit 5 for an apparatus #1, an interface card 6, another interface card 7, a circuit card 8 for an apparatus #2, and a circuit card 9 for an apparatus #3.

Referring particularly to FIGS. 7 and 10, the apparatus controlling circuit card 3 is mounted on the basic shelf apparatus 1 and has a connecting terminal 3A for connection to a bus line 10 provided at a rear end thereof. The apparatus controlling circuit card 3 includes an apparatus controlling circuit 3E for controlling operation of the other circuit cards.

Referring now to FIGS. 7 and 9, the circuit card 4 for an apparatus #0 includes a circuit composing portion or arbitrary functioning circuit 4E corresponding to the identification number ID=0 and has a connecting terminal 4A for connection to the bus line 10 at a rear end thereof.

The circuit card 5 for an apparatus #1 includes a circuit composing portion or arbitrary functioning circuit 5E corresponding to the identification number ID=1 and has a connecting terminal 5A for connection to the bus line 10 at a rear end thereof.

Referring to FIGS. 7 and 8, the interface card 6 is mounted on the basic shelf apparatus 1 and has a connecting terminal 6A for connection to the bus line 10 at a rear end thereof. The interface card 6 includes a connecting circuit or bus line 6C for interconnecting the basic shelf apparatus 1 and the extension shelf apparatus 2.

The other interface card 7 is mounted on the extension shelf apparatus 2 and has a connecting terminal 7A for connection to another bus line 11 at a rear end thereof. The interface card 7 includes a connecting circuit or bus line 7C for interconnecting the basic shelf apparatus 1 and the extension shelf apparatus 2.

Referring back to FIGS. 7 and 9, the circuit card 8 for an apparatus #2 includes a circuit composing portion or arbitrary functioning circuit 8E corresponding to the identification number ID=2 and further has a connecting terminal 8A for connection to the bus line 11 at a rear end thereof.

The circuit card 9 for an apparatus #3 includes a circuit composing portion or arbitrary functioning circuit 9E corresponding to the identification number ID=3 and further has a connecting terminal 9A for connection to the bus line 11 at a rear end thereof.

The bus line 10 is fixed to and extends along a rear face of the basic shelf apparatus 1 and interconnects the cards inserted in the basic shelf apparatus 1. In particular, the bus line 10 interconnects the apparatus controlling circuit card 3, the circuit card 4 for an apparatus #0, the circuit card 5 for an apparatus #1 and the interface card 6 by way of a plurality of connecting terminals 3A, 4A, 5A and 6A, respectively, so as to transmit input/output signals among them.

The other bus line 11 is fixed to and extends along a rear face of the extension shelf apparatus 2 and interconnects the cards inserted in the extension shelf apparatus 2. In particular, the bus line 11 interconnects the interface card 7, the circuit card 8 for an apparatus #2 and the circuit card 9 for an apparatus #3 by way of a plurality of connecting terminals 7A, 8A and 9A, respectively, so as to transmit input/output signals among them.

A further bus line 12 extends between and interconnects the interface card 6 in the basic shelf apparatus 1 and the interface card 7 in the extension shelf apparatus 2 so that it interconnects the bus lines 10 and 11 by way of the bus line 6C in the interface card 6 and the bus line 7C in the interface card 7, respectively.

The connecting terminals 3A, 4A, 5A, 6A, 7A, 8A and 9A provided on the circuit cards 3, 4, 5, 6, 7, 8 and 9 are connected to the rear ends of the bus lines 3C, 4C, 5C, 6C, 7C, 8C and 9C on the cards 3, 4, 5, 6, 7, 8 and 9, respectively, and serve as input/output terminals of the circuits on the cards.

Dip switches 4B, 5B, 8B and 9B are provided on the circuit cards 4, 5, 8 and 9, respectively, and are used to set the identification numbers ID=0, 1, 2 and 3 for the circuit card 4 for an apparatus #0, the circuit card 5 for an apparatus number #1, the circuit card 8 for an apparatus number #2 and the circuit card 9 for an apparatus number #3, respectively.

Bus/ID matching circuits 4D, 5D, 8D and 9D are provided on the circuit cards 4, 5, 8 and 9, respectively, and are each constructed such that, when it receives an input or output signal corresponding to the identification number ID set by the corresponding dip switch 4B, 5B, 8B or 9B, it establishes a connecting condition between the bus line 10 or 11 and the circuit of the corresponding circuit card.

With the construction of the circuit card mounting shelf apparatus described above, when the apparatus is to be assembled, the apparatus controlling circuit card 3, the circuit card 4 for an apparatus #0, the circuit card 5 for an apparatus number #1 and the interface card 6 are successively inserted in position into the basic shelf apparatus 1 so that the respective connecting terminals 3A, 4A, 5A and 6A are connected to the bus line 10.

Then, the dip switch 48 on the circuit card 4 for an apparatus #0 is set to the identification number ID=0. Thereafter, the dip switch 5B on the circuit card 5 for an apparatus #1 is set to the identification number ID=1.

Then, the interface card 7, the circuit card 8 for an apparatus #2 and the circuit card 9 for an apparatus #3 are successively inserted in position into the extension shelf apparatus 2 so that the respective connecting terminals 7A, 8A and 9A are connected to the bus line 11.

Then, the dip switch 8B on the circuit card 8 for an apparatus #2 is set to the identification number ID=2. Then, the dip switch 9B on the circuit card 9 for an apparatus #3 is set to the identification number ID=3.

The apparatus is thus completed. With the apparatus, the circuit card 4 for an apparatus #0, the circuit card 5 for an apparatus #1, the circuit card 8 for an apparatus #2 and the circuit card 9 for an apparatus #3 execute required calculating operations under the control of the apparatus controlling circuit card 3.

In this instance, control signals and input/output signals are transmitted by way of the bus lines 10, 12 and 11, and a matching operation is performed by each of the bus/ID matching circuits 4D, 5D, 8D and 9D based on the identification number set by the corresponding dip switch 4B, 5B, 8B or 9B so that communication of signals from and to a corresponding one of the circuit cards 4, 5, 8 and 9 is performed.

The conventional circuit card mounting shelf apparatus described above, however, has the following subjects to be solved.

In particular, since identification of each circuit card is performed based on an identification number ID set artificially by means of a dip switch in an assembling operation, a same ID may possibly be set to different circuit cards by an artificial error. This makes a factor of occurrence of a trouble upon maintenance or operation of the apparatus.

Accordingly, it is desirable for an identification number to be set not by an artificial operation upon assembly of the apparatus but automatically in accordance with the position of the circuit or the like.

Also it is necessary that the circuit card mounting shelf apparatus can be used even in such a case that an extension shelf apparatus is provided additionally to a basic shelf apparatus without disturbing such universality of the shelf apparatus realized with conventional apparatus that several circuit cards can be installed arbitrarily.

SUMMARY OF THE INVENTION

It is an object of the present invention to provide a circuit card mounting shelf apparatus having an automatic identification number setting function by which the identification number of a circuit card can be set automatically without the necessity of an artificial operation while maintaining the universality of the shelf apparatus which is realized with conventional apparatus.

It is another object of the present invention to provide a circuit card mounting shelf apparatus having an automatic identification number setting function which automatically sets an identification number to eliminate the necessity of artificial setting of the identification number by means of a dip switch upon assembling operation to prevent such a situation with certainty that a same identification number is set to different circuit cards by an artificial error, thereby preventing otherwise possible occurrence of a trouble upon maintenance or operation of the apparatus, which may be caused by the identification number set in error, with certainty.

It is a further object of the present invention to provide a circuit card mounting shelf apparatus having an automatic identification number setting function wherein, when an extension shelf provided additionally to a basic shelf, an arbitrary circuit card can be installed and the identification number of the circuit card can be set automatically without the necessity of an artificial operation while maintaining the universality of the shelf apparatus realized with conventional apparatus.

It is a still further object of the present invention to provide a circuit card mounting shelf apparatus having an automatic identification number setting function wherein an interface card for connection can be inserted into any of a basic shelf and an extension shelf to allow the interface card for connection to be used universally.

In order to attain the objects described above, according to an aspect of the present invention, there is provided a circuit card mounting shelf apparatus having an automatic identification number setting function, which comprises a plurality of circuit cards having respective identification number setting connectors mounted thereon which are different from one another, a shelf having a back board for mounting the circuit cards thereon, and a plurality of wiring lines formed on the back board for interconnecting the identification number setting connectors of the circuit cards so that, when any of the circuit cards is mounted on the back board, the identification number setting connector on the circuit card cooperates with the wiring lines to automatically set an identification number of the circuit card.

With the circuit card mounting shelf apparatus having an automatic identification setting function, when the circuit cards are mounted on the back board of the shelf, the identification number setting connectors on the circuit cards are interconnected by and cooperate with the wiring lines formed on the back board to automatically set the identification numbers of the circuit boards.

Each of the identification number setting connectors may include a plurality of connecting pins which cooperate, when the circuit card is mounted on the back board, with the wiring lines to form a plurality of switches which have a combination of on and off states peculiar to the identification number setting connector and hence to the circuit board, thereby to automatically set the identification number of the circuit card. Preferably, the identification numbers of the circuit cards are automatically set in the form of binary information. Thus, when any of the circuit cards is mounted on the back board, the connecting pins of the identification number setting connector on the circuit card cooperate with the wiring lines to form a plurality of switches which have a combination of on and off states peculiar to the identification number setting connector and hence to the circuit board, and consequently, the identification number of the circuit card is automatically set in the form of binary information.

According to another aspect of the present invention, there is provided a circuit card mounting shelf apparatus having an automatic identification number setting function, which comprises a plurality of first circuit cards having respective identification number setting connectors mounted thereon which are different from one another, a first shelf having a back board for mounting the first circuit cards thereon, a plurality of second circuit cards having respective identification number setting connectors mounted thereon which are different from one another, a second shelf having a back board for mounting the second circuit cards thereon, the first circuit cards including a first interface card for connection to the second shelf while the second circuit cards include a second interface card for connection to the first shelf, a plurality of first wiring lines formed on the back board of the first shelf for interconnecting the identification number setting connectors of the first circuit cards so that, when any of the first circuit cards is mounted on the back board of the first shelf while the first and second shelves are interconnected by the first and second interface cards, the identification number setting connector on the first circuit card cooperates with the first wiring lines to automatically set an identification number of the first circuit card, and a plurality of second wiring lines formed on the back board of the second shelf for interconnecting the identification number setting connectors of the second circuit cards so that, when any of the second circuit cards is mounted on the back board of the second shelf while the first and second shelves are interconnected by the first and second interface cards, the identification number setting connector on the second circuit card cooperates with the second wiring lines to automatically set an identification number of the second circuit card.

With the circuit card mounting shelf apparatus having an automatic identification setting function, when the first circuit cards are mounted on the back board of the first shelf and the second circuit cards are mounted on the back board of the second shelf while the first and second interface cards are connected to each other to interconnect the first and second shelves, the identification number setting connectors on the first circuit cards are interconnected by and cooperate with the first wiring lines formed on the back board of the first shelf while the identification number setting connectors on the second circuit cards are interconnected by and cooperate with the second wiring lines formed on the back board of the second shelf to automatically set the identification numbers of the first and second circuit boards.

Each of the identification number setting connectors of the first and second circuit cards may include a plurality of connecting pins which cooperate, when the circuit card is mounted on the back board of the first or second shelf, with the wiring lines on the first or second shelf to form a plurality of switches which have a combination of on and off states peculiar to the identification number setting connector among the identification number setting connectors on the first or second shelf and hence to the circuit board among the first or second circuit boards, thereby to automatically set the identification number of the circuit card. Preferably, the identification numbers of the first and second circuit cards are automatically set in the form of binary information. Thus, when any of the first and second circuit cards is mounted on the back board of the first or second shelf, the connecting pins of the identification number setting connector on the first or second circuit card cooperate with the first or second wiring lines to form a plurality of switches which have a combination of on and off states peculiar to the identification number setting connector and hence to the first or second circuit board, and consequently, the identification number of the first or second circuit card is automatically set in the form of binary information. The identification number setting connector on each of the first and second interface cards may be connected to a short-circuiting wiring line formed on the interface card for realizing an on state of one of the switches of the interface card.

Preferably, the first wiring lines and the second wiring lines are formed in the same wiring pattern. This allows the first and second shelves to be exchanged for each other and thus assures the universality of the circuit card mounting shelf apparatus.

Preferably, the first interface card and the second interface card have the same structure. This assures the universality between the first and second interface cards.

The circuit card mounting shelf apparatus having an automatic identification number setting function may be constructed such that each of the first and second interface cards has a short-circuiting wiring line formed thereon and connected to the identification number setting connector thereof for realizing an on state of one of the switches of the interface card, and the first and second interface cards are mounted at different positions from each other on the back boards of the first and second shelves, respectively, to realize the on and off states of the switches of the first and second interface cards. Thus, the on and off states of the switches of the first and second interface cards can be realized by making the mounting positions of the first and second interface cards on the back boards of the first and second shelves different from each other.

With any of the circuit card mounting shelf apparatus having an automatic identification number setting function, identification of a circuit card need not be performed based on an identification number set artificially by means of a dip switch upon assembling operation and the identification number of a circuit card is set automatically. Consequently, there is an advantage in that such a situation that a same identification number is set to different circuit cards by an artificial error can be set with certainty, and accordingly, otherwise possible occurrence of a trouble upon maintenance or operation of the apparatus, which may be caused by the identification number set in error, can be prevented with certainty.

Further, in such a case that an extension shelf (second shelf) is provided additionally to a basic shelf (first shelf), an arbitrary circuit card can be installed and an identification number of the circuit card can be set automatically. Thus, there is another advantage in that an identification number of a circuit card can be set without the necessity of an artificial operation while maintaining the universality of the shelf apparatus realized with conventional apparatus.

In addition, since the interface cards can be inserted into any of the first and second shelves (basic and extension shelves), there is a further advantage in that the interface cards can be utilized universally.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENT

Referring first to FIGS. 1 to 4, there are shown a circuit card mounting shelf apparatus to which the present invention is applied and several circuit cards for use with the circuit card mounting shelf apparatus. The circuit card mounting shelf apparatus includes a basic shelf apparatus 1 which is in the form of a frame structure having a parallelepiped profile and is adapted to mount a suitable circuit card or cards thereon to construct a desired extension calculating apparatus section.

The circuit card mounting shelf apparatus further includes an extension shelf apparatus 2 which also has a frame structure having a parallelepiped profile and is adapted to mount an extension circuit card or cards thereon to construct a desired extension calculating apparatus section.

Figure 1:
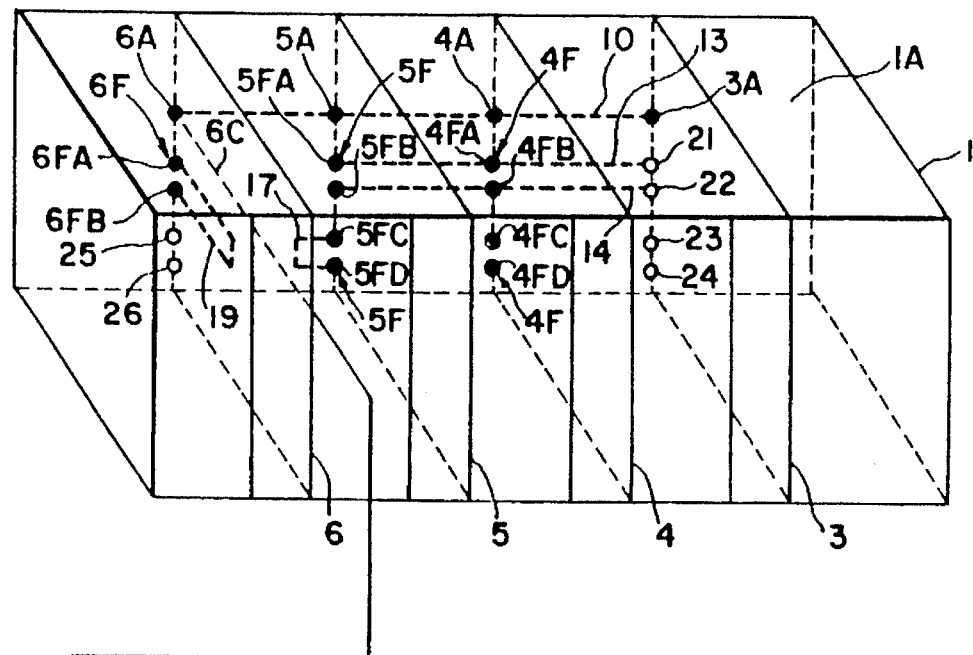
FIG. 1 is a schematic perspective view of a circuit card mounting shelf apparatus showing a preferred embodiment of the present invention.
Figure 1:
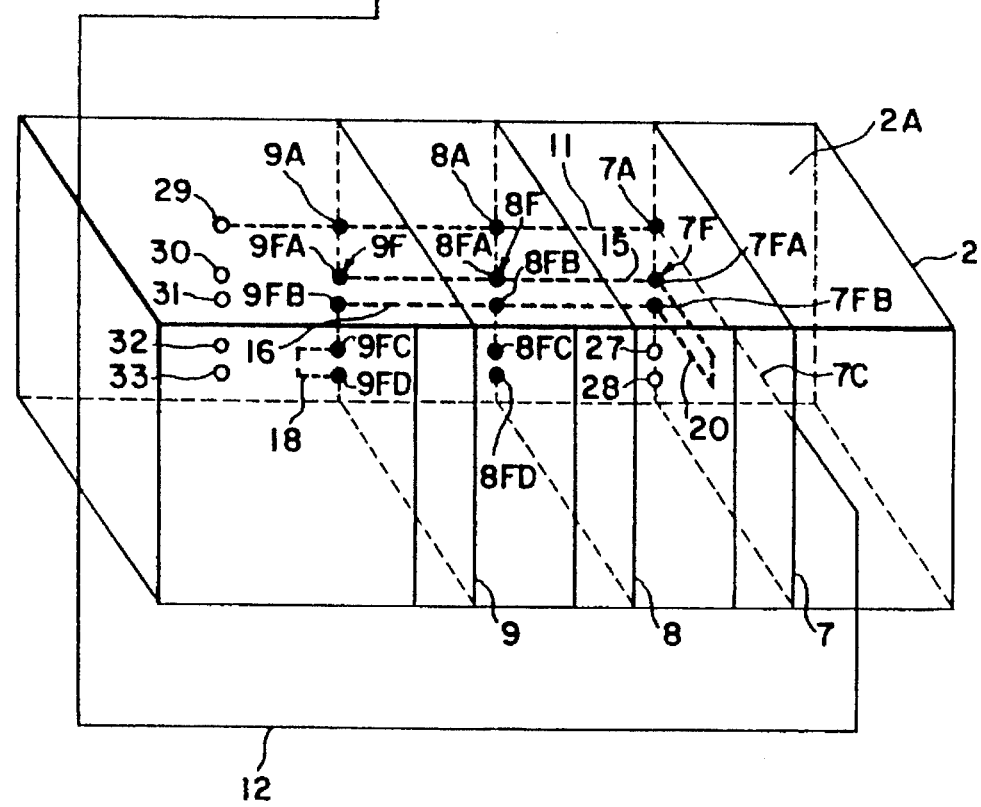
Figure 4:
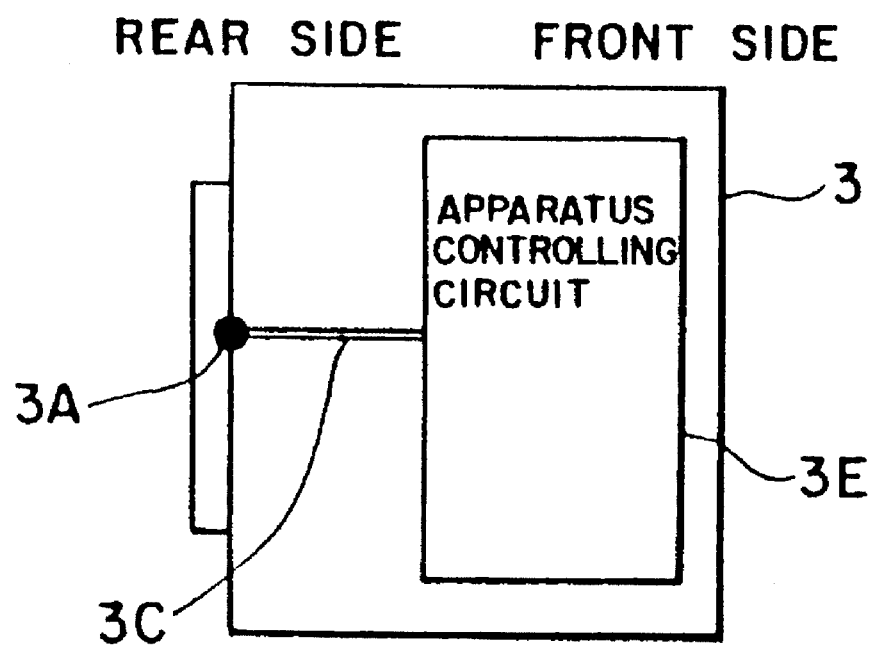
FIG. 4 is a schematic view showing general construction of an apparatus controlling circuit card for use with the circuit card mounting shelf apparatus.

Referring particularly to FIGS. 1 and 4, the circuit cards for use with the circuit card mounting shelf apparatus include an apparatus controlling circuit card 3 which is mounted on the basic shelf apparatus 1 and has a connecting terminal 3A for connection to a bus line 10 at a rear end thereof. The apparatus controlling circuit card 3 further includes an apparatus controlling circuit 3E for controlling operation of the other circuit cards.

Figure 3:
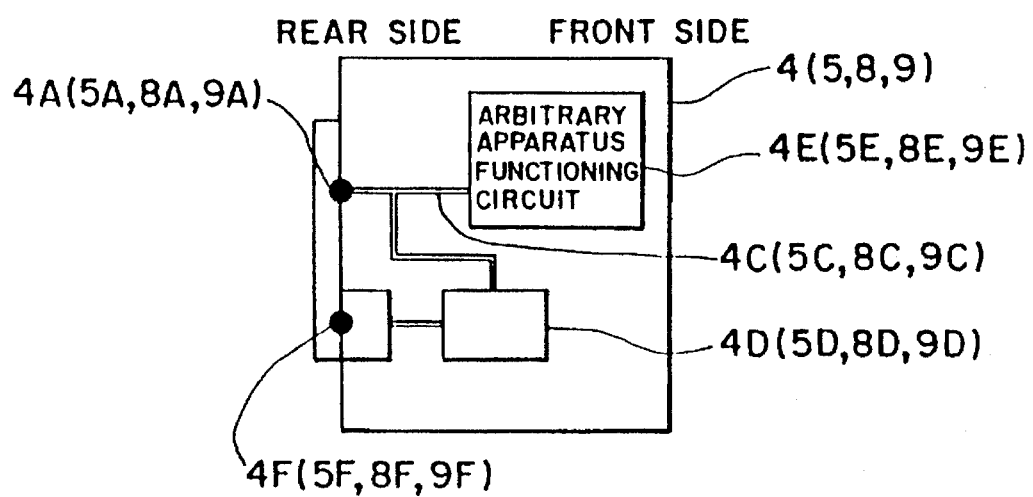
FIG. 3 is a schematic view showing general construction of an apparatus circuit card for use with the circuit card mounting shelf apparatus.

Referring now to FIGS. 1 and 3, a circuit card 4 for an apparatus #0 includes a circuit composing section or arbitrary functioning circuit 4E corresponding to the identification number ID=0 and has a connecting terminal 4A for connection to the bus line 10 at a rear end thereof.

A circuit card 5 for an apparatus #1 includes a circuit composing section or arbitrary functioning circuit 5E corresponding to the identification number ID=1 and has a connecting terminal 5A for connection to the bus line 10 at a rear end thereof.

Figure 2:
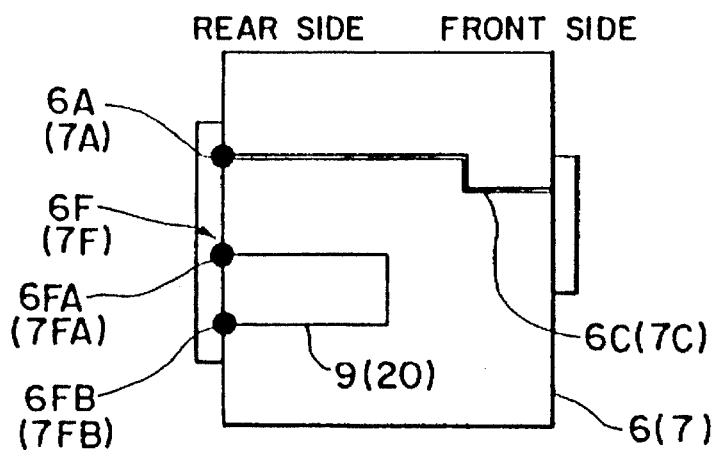
FIG. 2 is a schematic view showing general construction of an interface card for use with the circuit card mounting shelf apparatus.

Referring now to FIGS. 1 and 2, an interface card 6 is mounted on the basic shelf apparatus 1 and has a connecting terminal 6A for connection to the bus line 10 at a rear end thereof. The interface card 6 includes a connecting circuit or bus line 6C for interconnecting the basic shelf apparatus 1 and the extension shelf apparatus 2. The interface card 6 further has an identification number setting connector 6F provided at a rear end thereof and has a wiring line 19 provided thereon for connecting a pair of connecting pins 6FA and 6FB of the identification number setting connector 6F to each other.

Another interface card 7 is mounted on the extension shelf apparatus 2 and has a connecting terminal 7A for connection to another bus line 11 at a rear end thereof. The interface card 7 includes a connecting circuit or bus line 7C for interconnecting the basic shelf apparatus 1 and the extension shelf apparatus 2. The interface card 7 further has an identification number setting connector 7F provided at a rear end thereof and has a wiring line 20 provided thereon for connecting a pair of connecting pins 7FA and 7FB of the identification number setting connector 7F to each other.

In this manner, the interface cards 6 and 7 have the same construction and can be exchanged for each other to assure the universality.

Referring back to FIGS. 1 and 3, a circuit card 8 for an apparatus #2 includes a circuit composing section or arbitrary functioning circuit 8E corresponding to the identification number ID=2 and has a connecting terminal 8A for connection to the bus line 11 at a rear end thereof.

A circuit card 9 for an apparatus #3 includes a circuit composing section or arbitrary functioning circuit 9E corresponding to the identification number ID=3 and has a connecting terminal 9A for connection to the bus line 11 at a rear end thereof.

Referring to FIGS. 1 to 4, the connecting terminals 3A, 4A, 5A, 6A, 7A, 8A and 9A are connected to the rear ends of bus lines 3C, 4C, 5C, 6C, 7C, 8C and 9C of the circuit cards 3, 4, 5, 6, 7, 8 and 9, respectively, and thus serve as input/output terminals of the circuits on the respective circuit cards.

The bus line 10 is fixed to and extends along a rear face of the basic shelf apparatus 1 and interconnects the cards inserted in the basic shelf apparatus 1. In particular, the bus line 10 interconnects the apparatus controlling circuit card 3, the circuit card 4 for an apparatus #0, the circuit card 5 for an apparatus #1 and the interface card 6 by way of the connecting terminals 3A, 4A, 5A and 6A, respectively, so as to communicate input/output signals among them.

The other bus line 11 is fixed to and extends along a rear face of the extension shelf apparatus 2 and interconnects the cards inserted in the extension shelf apparatus 2. In particular, the bus line 11 interconnects the interface card 7, the circuit card 8 for an apparatus #2 and the circuit card 9 for an apparatus #3 by way of the connecting terminals 7A, 8A and 9A, respectively, so as to communicate input/output signals among them.

A further bus line 12 extends between and interconnects the interface card 6 in the basic shelf apparatus 1 and the interface card 7 in the extension shelf apparatus 2 so that it interconnects the bus lines 10 and 11 by way of the bus line 6C on the interface card 6 and the bus line 7C on the interface card 7.

Identification number setting connectors 4F and 5F are provided at the rear ends of the circuit card 4 for an apparatus #0 and the circuit card 5 for an apparatus #1, respectively, and each includes four connecting pins 4FA, 4FB, 4FC and 4FD or 5FA, 5FB, 5FC and 5FD.

The identification number setting connectors 6F and 7F are provided at the rear ends of the interface cards 6 and 7 and each includes two connecting pins 6FA and 6FB or 7FA and 7FB.

Similarly, identification number setting connectors 8F and 9F are provided at the rear ends of the circuit card 8 for an apparatus number #2 and the circuit card 9 for an apparatus #3, respectively, and each includes four connecting pins 8FA, 8FB, 8FC and 8FD or 9FA, 9FB, 9FC and 9FD.

Several wiring lines 13 to 18 are provided on the basic shelf apparatus 1 and the extension shelf apparatus 2. In particular, the wiring line 13 is provided in a desired pattern on a back shelf 1A of the basic shelf apparatus 1 and interconnects the connecting pin 4FA of the identification number setting connector 4F of the circuit card 4 for an apparatus #0 and the connecting pin 5FA of the identification number setting connector 5F of the circuit card 5 for an apparatus #1.

The wiring line 14 is provided in a desired pattern on the back shelf 1A of the basic shelf apparatus 1 such that it may be paired with the wiring line 13. The wiring line 14 interconnects the connecting pin 4FB of the identification number setting connector 4F of the circuit card 4 for an apparatus #0 and the connecting pin 5FB of the identification number setting connector 5F of the circuit card 5 for an apparatus #1.

The wiring line 15 is provided in a desired pattern on a back shelf 2A of the extension shelf apparatus 2 and interconnects the connecting pin 7FA of the identification number setting connector 7F of the interface card 7, the connecting pin 8FA of the identification number setting connector 8F of the circuit card 8 for an apparatus #2 and the connecting pin 9FA of the identification number setting connector 9F of the circuit card 9 for an apparatus #3.

The wiring line 16 is provided in a desired pattern on the back shelf 2A of the extension shelf apparatus 2 such that it may be paired with the wiring line 15. The wiring line 16 interconnects the connecting pin 7FB of the identification number setting connector 7F of the interface card 7, the connecting pin 8FB of the identification number setting connector 8F of the circuit card 8 for an apparatus #2 and the connecting pin 9FB of the identification number setting connector 9F of the circuit card 9 for an apparatus #3.

The wiring line 17 is provided in a desired pattern on the back shelf 1A of the basic shelf apparatus 1 and interconnects the connecting pins 5FC and 5FD of the identification number setting connector 5F of the circuit card 5 for an apparatus #1.

The wiring line 18 is provided in a desired pattern on the back shelf 2A of the extension shelf apparatus 2 and interconnects the connecting pins 9FC and 9FD of the identification number setting connector 9F of the circuit card 9 for an apparatus #3.

In this manner, the wiring lines 13, 14 and 17 of the basic shelf apparatus 1 and the wiring lines 15, 16 and 18 of the extension shelf apparatus 2 are formed in the same patterns as each other, respectively, and consequently, the basic shelf apparatus 1 and the extension shelf apparatus 2 can be exchanged for each other, thereby assuring the universality between the shelf apparatus.

The identification number setting connectors 4F, 5F, 6F, 7F, 8F and 9F cooperate with the wiring lines 13, 14, 15, 16, 17, 18, 19 and 20 to automatically identify the circuit cards 4, 5, 8 and 9 from one another to set the identification numbers ID=0, 1, 2 and 3, respectively.

Bus/ID matching circuits 4D, 5D, 8D and 9D are provided on the circuit cards 4, 5, 8 and 9, respectively. Each of the bus/ID matching circuits 4D, 5D, 8D and 9D is constructed such that, when it receives an input or output signal corresponding to the identification number ID set by corresponding ones of the identification number setting connectors 4F to 9F and the wiring lines 13 to 20, it establishes a connecting condition between the bus line 10 or 11 and the circuit of the corresponding circuit card.

The back boards 1A and 2A have connecting portions 21 to 26 and 27 to 33 for connection to the circuit cards inserted in the basic shelf apparatus 1 and the extension shelf apparatus 2, respectively. The back boards 1A and 2A further have similar connecting portions indicated by dark round or dot marks in FIG. 1. As can be recognized from the foregoing description, each of the circuit cards 3 to 5, 8 and 9 and the interface cards 6 and 7 has four connecting pins, and the connecting pins of the cards 3 to 9 can be attached to the connecting portions of the back boards 1A and 2A.

With the circuit card mounting shelf apparatus of the construction described above, when it is to be assembled, the apparatus controlling circuit card 3, the circuit card 4 for an apparatus #0, the circuit card 5 for an apparatus #1 and the interface card 6 are successively inserted in position into the basic shelf apparatus 1 so that the connecting terminals 3A, 4A, 5A and 6A thereof are connected to the bus line 10.

In this instance, the identification number setting connectors 4F and 5F are connected to the wiring lines 13, 14 and 17 in the following manner.

Figure 6:
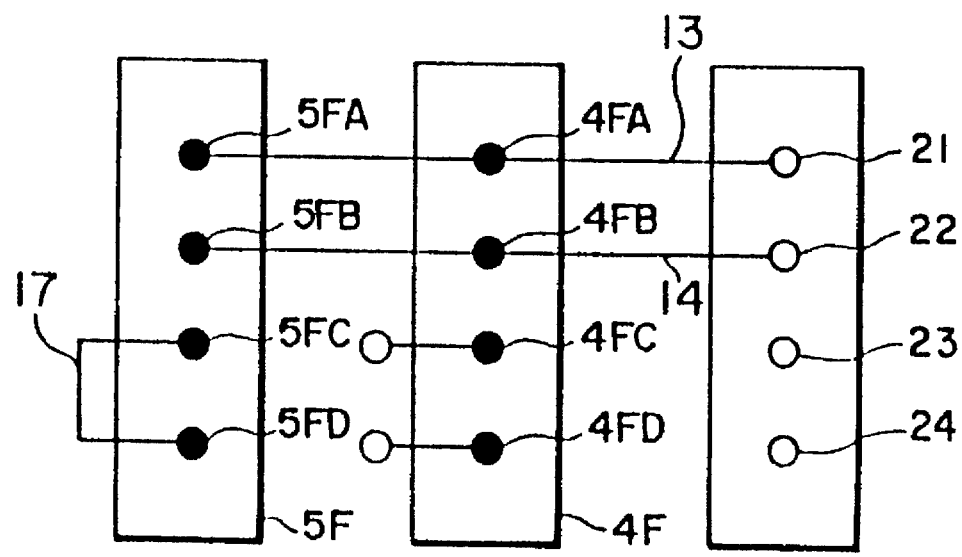
FIG. 6 is a diagrammatic representation showing connecting conditions of identification number setting connectors of the circuit card mounting shelf apparatus.
Figure 6:
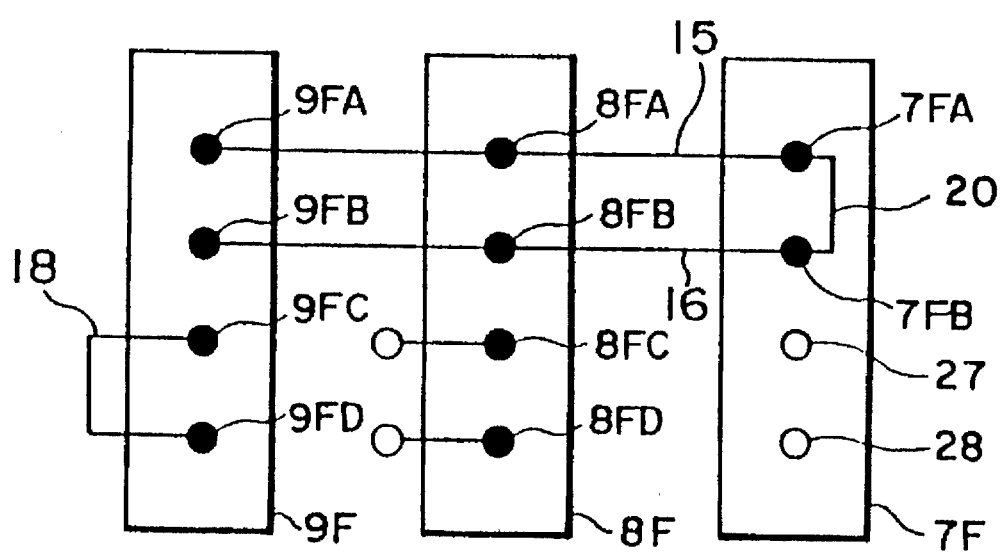
Figure 7:
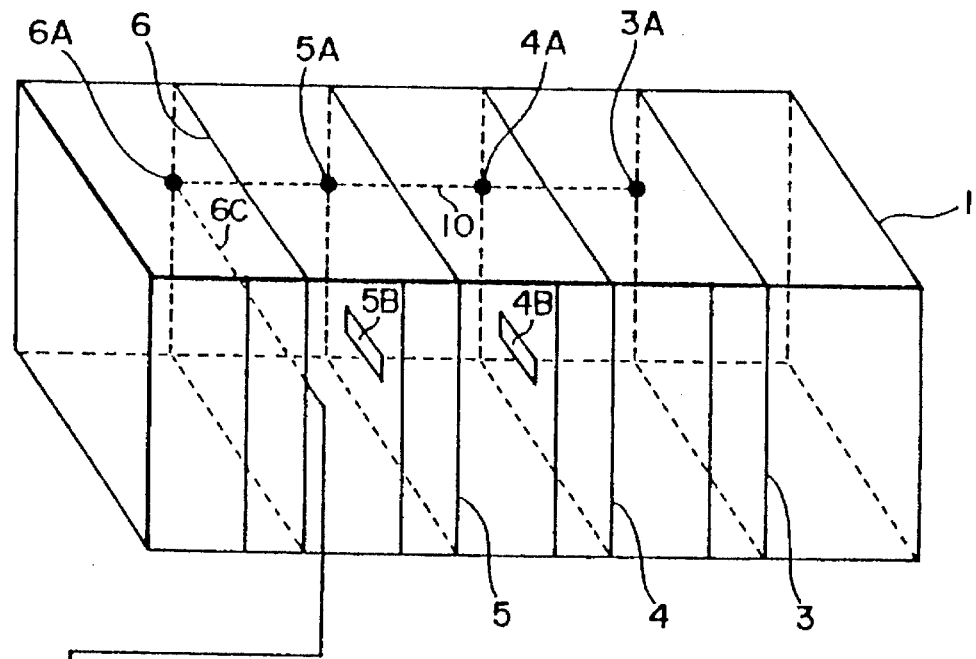
FIG. 7 is a schematic perspective view showing a conventional circuit card mounting shelf apparatus.
Figure 7:
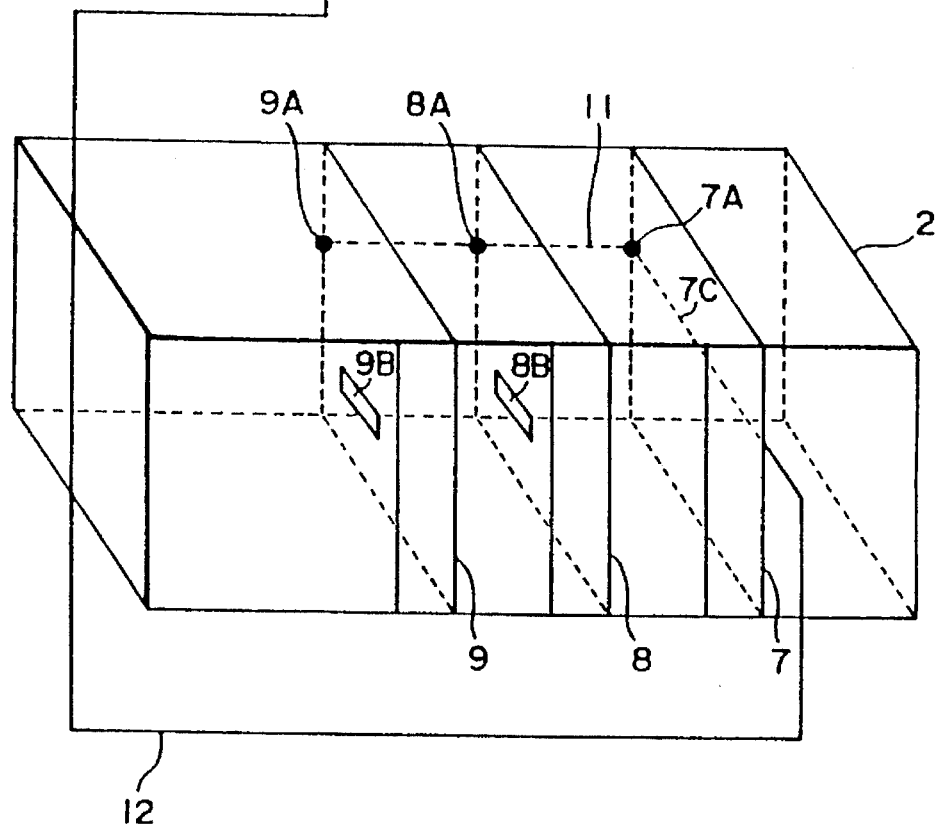
Figure 8:
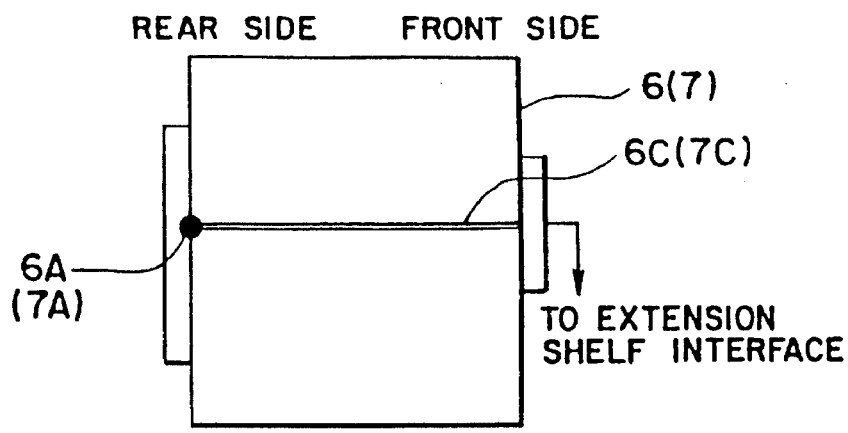
FIG. 8 is a schematic view showing an interface card for use with the conventional circuit card mounting shelf apparatus.
Figure 9:
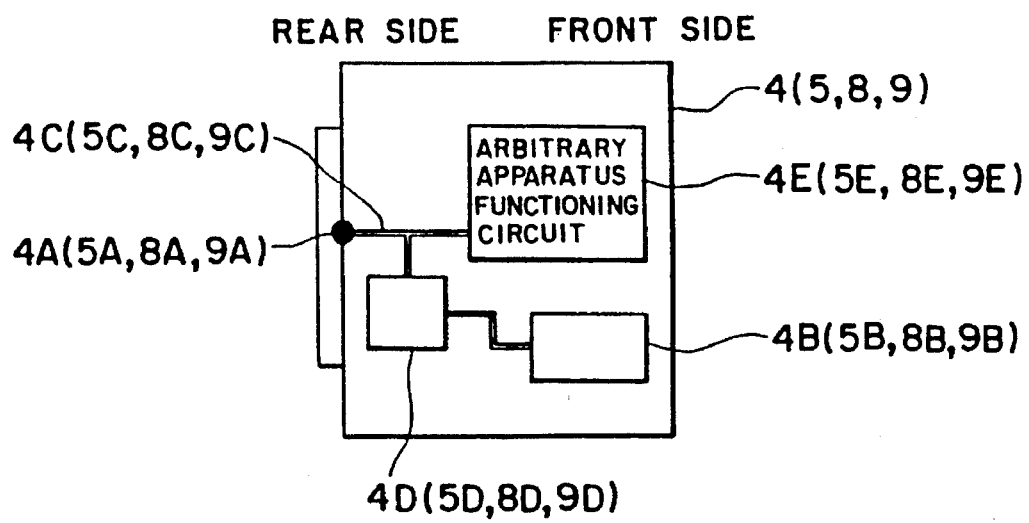
FIG. 9 is a schematic view showing an apparatus circuit card for use with the conventional circuit card mounting shelf apparatus.
Figure 10:
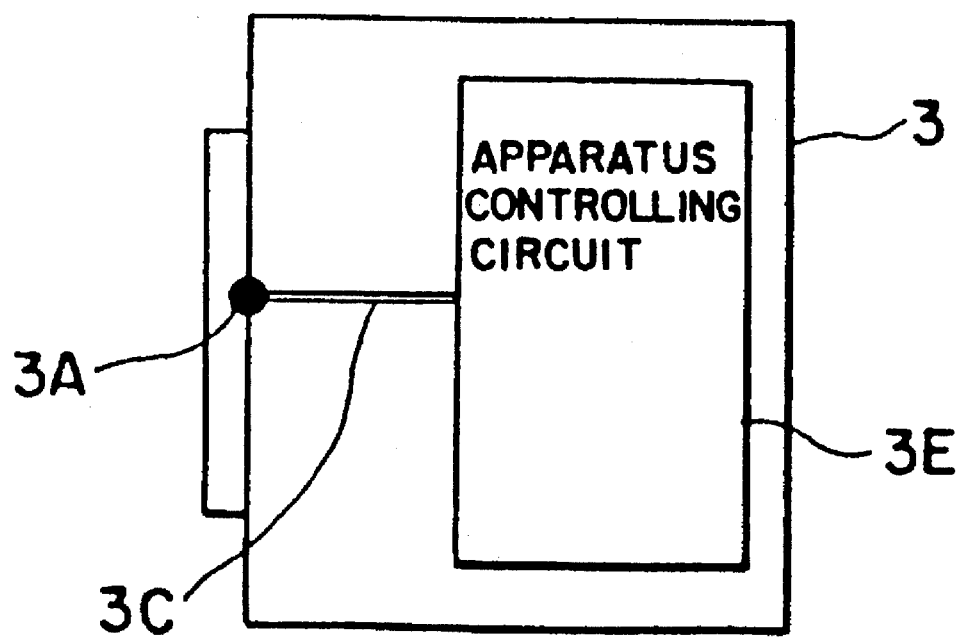
FIG. 10 is a schematic view showing an apparatus controlling circuit card for use with the conventional circuit card mounting shelf apparatus.

In particular, the connecting conditions of the identification number setting connectors 4F and 5F are such as shown in FIG. 6 wherein the connecting pin 4FA of the identification number setting connector 4F of the circuit card 4 for an apparatus #0 and the connecting pin 5FA of the identification number setting connector 5F of the circuit card 5 for an apparatus #1 are connected to each other by way of the wiring line 13.

Meanwhile, the connecting pin 4FB of the identification number setting connector 4F of the circuit 4 for an apparatus #0 and the connecting pin 5FB of the identification number setting connector 5F of the circuit card 5 for an apparatus #1 are connected to each other by way of the wiring line 14.

Further, the connecting pins 5FC and 5FD of the identification number setting connector 5F of the circuit card 5 for an apparatus #1 are connected to each other by way of the wiring line 17.

Figure 5:
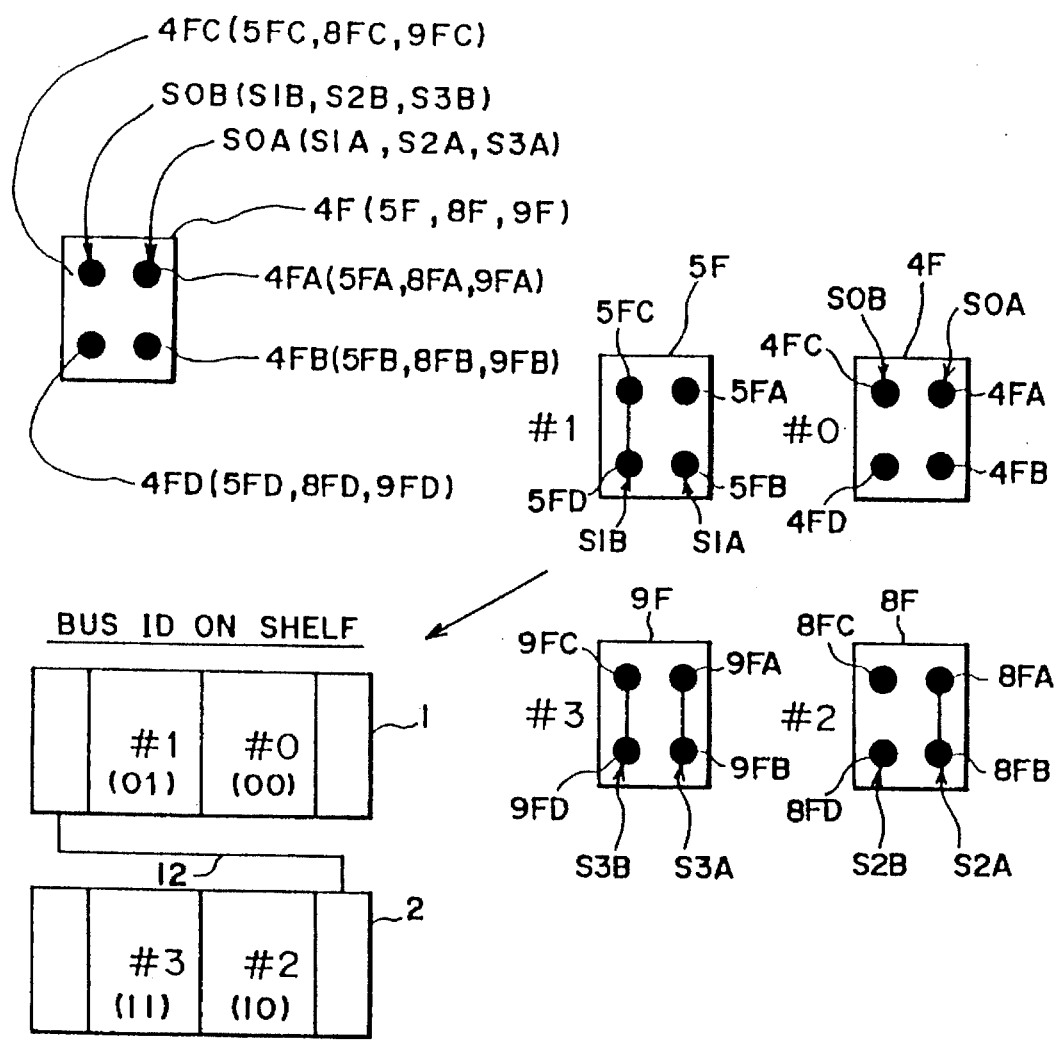
FIG. 5 is a diagrammatic representation illustrating automatic identification number setting operation of the circuit card mounting shelf apparatus.

Consequently, in the identification number setting connector 4F of the circuit card 4 for an apparatus #0, a switch SOA is constituted from the connecting pins 4FA and 4FB while another switch SOB is constituted from the connecting pins 4FC and 4FD as shown in FIG. 5. In other words, since the wiring lines 13 and 14 are not connected to each other (or short-circuited), the connecting pins 4FA and 4FB are not connected to each other, and accordingly, the switch SOA is in an off state (=0).

Further, since the connector pins 4FC and 4FD are connected to no wiring line, also the switch SOB is in an off state (=0).

Accordingly, with the identification number setting connector 4F, the switching condition wherein the switch SOA is in an off state (=0) and also the switch SOB is in an off state (=0) is realized, and the identification individuality of the identification number setting connector 4F is recognized to be "00".

In this manner, the identification number ID=00 of the circuit card 4 for an apparatus #0 is set in binary value.

Meanwhile, with the circuit card 5 for an apparatus #1, the connecting condition of the identification number setting connector 5F is such as shown in FIG. 6 wherein the connecting pin 4FA of the identification number setting connector 4F of the circuit card 4 for an apparatus #0 and the connecting pin 5FA of the identification number setting connector 5F of the circuit card 5 for an apparatus #1 are connected to each other by way of the wiring line 13.

Meanwhile, the connecting pin 4FB of the identification number setting connector 4F of the circuit card 4 for an apparatus #0 and the connecting pin 5FB of the identification number setting connector 5F of the circuit card 5 for an apparatus #1 are connected to each other by way of the wiring line 14.

Further, the connecting pins 5FC and 5FD of the identification number setting connector 5F of the circuit card 5 for an apparatus #1 are connected to each other by way of the wiring line 17.

Consequently, with the identification number setting connector 5F of the circuit card 5 for an apparatus #1, a switch S1A is constituted from the connecting pins 5FA and 5FB while another switch S1B is constituted from the connecting pins 5FC and 5FD, respectively, as shown in FIG. 5. Here, since the wiring lines 13 and 14 are not connected to each other (or short-circuited), the connecting pins 5FA and 5FB are not connected to each other, and consequently, the switch S1A is in an off state (=0).

Meanwhile, since the connecting pins 5FC and 5FD are connected to each other by way of the wiring line 17, the switch 1B is in an on state (=1).

Consequently, with the identification number setting connector 5F, the switching condition wherein the switch S1A is in an off state (=0) and the switch 1B is in an on state (=1) is realized, and the identification individuality of the identification number setting connector 5F is recognized to be "01".

In this manner, the identification number ID=01 of the circuit card 5 for an apparatus #1 is set in the form of binary information.

Subsequently, the interface card 7, the circuit card 8 for an apparatus #2 and the circuit card 9 for an apparatus #3 are successively inserted in position into the extension shelf apparatus 2 so that the connecting terminals 7A, 8A and 9A thereof are connected to the bus line 11.

In this instance, the identification number setting connectors 7F, 8F and 9F are connected to the wiring lines 15, 16 and 18 in the following manner.

In particular, the connecting conditions of the identification number setting connectors 7F, 8F and 9F are such as shown in FIG. 6 wherein the connecting pin 7FA of the identification number setting connector 7F of the interface card 7, the connecting pin 8FA of the identification number setting connector 8F of the circuit card 8 for an apparatus #2 and the connecting pin 9FA of the identification number setting connector 9F of the circuit card 9 for an apparatus #3 are connected to one another by way of the wiring line 15.

Meanwhile, the connecting pin 7FB of the identification number setting connector 7F of the interface card 7, the connecting pin 8FB of the identification number setting connector 8F of the circuit card 8 for an apparatus #2 and the connecting pin 9FB of the identification number setting connector 9F of the circuit card 9 for an apparatus #3 are connected to one another by way of the wiring line 16.

Further, the connecting pins 9FC and 9FD of the identification number setting connector 9F of the circuit card 9 for an apparatus #3 are connected to each other by way of the wiring line 18.

Consequently, with the identification number setting connector 8F of the circuit card 8 for an apparatus #2, a switch S2A is constituted from the connecting pines 8FA and 8FB while another switch S2B is constituted from the connecting pins 8FC and 8FD as shown in FIG. 5. By the way, in the interface card 7, the wiring line 20 interconnects the connecting pins 7FA and 7FB of the identification number setting connector 7F. Consequently, the wiring lines 15 and 16 are connected to each other (short-circuited) by way of the wiring line 20 and the connecting pins 8FA and 8FB are connected to each other, and accordingly, the switch S2A is in an on state (=1).

Meanwhile, since the connecting pins 8FC and 8FD are connected to no wiring line, the switch S2B is in an off state (=0).

Consequently, with the identification number setting connector 8F, the switching condition wherein the switch S2A is in an on state (=1) and the switch S2B is in an off state (=0) is realized, and the identification individuality of the identification number setting connector 8F is recognized to be "10".

In this manner, the identification number ID=10 of the circuit card 8 for an apparatus #2 is set in the form of binary information.

On the other hand, with the circuit card 9 for an apparatus #3, the connecting condition of the identification number setting connector 9F is such as shown in FIG. 6 wherein the connecting pin 7FA of the identification number setting connector 7F of the interface card 7, the connecting pin 8FA of the identification number setting connector 8F of the circuit card 8 for an apparatus #2 and the connecting pin 9FA of the identification number setting connector 9F of the circuit card 9 for an apparatus #3 are connected to one another by way of the wiring line 15.

Meanwhile, the connecting pin 7FB of the identification number setting connector 7F of the interface card 7, the connecting pin 8FB of the identification number setting connector 8F of the circuit card 8 for an apparatus #2 and the connecting pin 9FB of the identification number setting connector 9F of the circuit card 9 for an apparatus #3 are connected to one another by way of the wiring ring 16.

Further, the connecting pins 9FC and 9FD of the identification number setting connector 9F of the circuit card 9 for an apparatus #3 are connected to each other by way of the wiring line 18.

Consequently, with the identification number setting connector 9F of the circuit card 9 for an apparatus #3, a switch S3A is constituted from the connecting pins 9FA and 9FB while another switch S3B is constituted from the connecting pins 9FC and 9FD as shown in FIG. 5. Here, since the wiring lines 15 and 16 are connected to each other (or short-circuited) by way of the wiring line 20 of the interface card 7, the connecting pins 9FA and 9FB are connected to each other, and consequently, the switch S2A is in an on state (=1).

Meanwhile, since the connecting pins 9FC and 9FD are connected to each other by way of the wiring line 18, the switch S2B is in an on state (=1).

Accordingly, with the identification number setting connector 9F, the switching condition wherein the switch S3A is in an on state (=1) and the switch S3B is in an on state (=1) is realized, and the identification individuality of the identification number setting connector 9F is recognized to be "11".

In this manner, the identification number ID=11 of the circuit card 9 for an apparatus #3 is set in the form of binary information.

The apparatus is completed in this manner. In the complete apparatus, the circuit card 4 for an apparatus #0, the circuit card 5 for an apparatus #1, the circuit card 8 for an apparatus #2 and the circuit card 9 for an apparatus #3 execute individually required calculating operations under the control of the apparatus controlling circuit card 3.

In this instance, control signals and input/output signals are transmitted by way of the bus lines 10, 12 and 11, and a matching operation is performed at each of the bus/ID matching circuit 4D, 5D, 8D and 9D based on the identification number ID automatically set thereto by cooperation between the identification number setting connectors 4F and 5F and the wiring lines 13, 14, 15, 16, 17 and 18 so that signals are communicated to or from a selected one of the circuit cards 4, 5, 8 and 9.

Accordingly, with the circuit card mounting shelf apparatus having an identification number setting function according to the present invention, identification of each card need not be performed based on an identification number set artificially by means of a dip switch in an assembling operation, but an identification number is set automatically. Consequently, the situation that a same identification number is set to different circuit cards by an artificial error can be prevented with certainty, and accordingly, occurrence of a trouble upon maintenance or operation of the apparatus which may otherwise be caused by setting of an erroneous identification number can be prevented with certainty. Further, in such a case that an extension shelf apparatus is to be additionally provided to a basic shelf apparatus, an identification number of a circuit card which is installed arbitrarily can be set automatically. Consequently, an identification number of a circuit card can be set automatically without the necessity of an artificial operation while maintaining the universality of the shelf apparatus which is realized with conventional apparatus.

The present invention is not limited to the specifically described embodiment, and variations and modifications may be made without departing from the scope of the present invention.

What is claimed is:

1. A circuit card mounting shelf apparatus having an automatic identification number setting function, comprising:

a plurality of first circuit cards having respective identification number setting connectors mounted thereon which are different from one another, each of said identification number setting connectors including a plurality of connecting pins;

a controlling card for controlling said first circuit cards;

a first shelf having a back board for mounting said first circuit cards and said controlling card thereon;

a plurality of second circuit cards having respective identification number setting connectors mounted thereon which are different from one another, each of said identification number setting connectors including a plurality of connecting pins, said second circuit cards being controlled by said controlling card;

a second shelf having a back board for mounting said second circuit cards thereon;

said first circuit cards including a first interface card for connection to said second shelf while said second circuit cards include a second interface card for connection to said first shelf;

said second interface card having a digit value setting circuit provided thereon and connected to an identification number setting connector provided on said second interface card for fixedly setting a value of a predetermined digit for an identification number;

a plurality of first wiring lines formed on said back board of said first shelf for interconnecting said identification number setting connectors of said first circuit cards so that, when any one of said first circuit cards is mounted on said back board of said first shelf while said first and second shelves are interconnected by said first and second interface cards, only the identification number setting connector on the first circuit card and said first wiring lines all provided on said first shelf are used independently of said second shelf so as to cooperate with each other to form a plurality of switches, each individually in one of an on and off state to automatically set an identification number of the first circuit card in accordance with the on/off state of the switches; and a plurality of second wiring lines formed on said back board of said second shelf for interconnecting said identification number setting connectors of said second circuit cards so that, when any one of said second circuit cards is mounted on said back board of said second shelf while said first and second shelves are interconnected by said first and second interface cards, only the identification number setting connector on said second circuit card, said digit value setting circuit on said second interface card and said second wiring lines all provided on said second shelf are used independently of said first shelf so as to cooperate with one another to form a plurality of switches, each being individually in one of an on and off state to automatically set an identification number of the second circuit card in accordance with the on/off states of the switches.

2. A circuit card mounting shelf apparatus having an automatic identification number setting function as claimed in claim 1, wherein the identification numbers of said first and second circuit cards are automatically set in the form of binary information.

3. A circuit card mounting shelf apparatus having an automatic identification number setting function as claimed in claim 1, wherein said digit value setting circuit is constructed as a short circuit for realizing an on state of one of the switches of the interface card.

4. A circuit card mounting shelf apparatus having an automatic identification number setting function as claimed in claim 1, wherein said first wiring lines and said second wiring lines are formed in the same wiring pattern.

5. A circuit card mounting shelf apparatus having an automatic identification number setting function as claimed in claim 1, wherein said first interface card and said second interface card have the same structure.

6. A circuit card mounting shelf apparatus having an automatic identification number setting function as claimed in claim 1, wherein each of said first and second interface cards has a short-circuiting wiring line formed thereon and connected to the identification number setting connector thereof for realizing an on state of one of the switches of the interface card, and said first and second interface cards are mounted at different positions from each other on said back boards of said first and second shelves, respectively, to realize the on and off states of the switches of said first and second interface cards.

7. A circuit card mounting shelf apparatus having an automatic identification number setting function as claimed in claim 1, wherein said digit value setting circuit is constructed as a circuit for fixedly setting a value of the uppermost bit of an identification number represented in binary notation.

8. A circuit card mounting shelf apparatus having an automatic identification number setting function, comprising:

a basic shelf including a back board, a plurality of circuit cards mounted on said back board, and a controlling card mounted on said back board for controlling said circuit cards;

an extension shelf for extension of said basic shelf and including a back board and a plurality of extension circuit cards mounted on said back board of said extension shelf and controlled by said controlling card of said basic shelf;

an identification number setting connector provided respectively on each of said extension circuit cards and including a plurality of connecting pins;

said extension circuit cards including an interface card for connection to said basic shelf;

a digit value setting circuit provided on said interface card and connected to an identification number setting connector provided on said interface card for fixedly setting a value of a predetermined digit for an identification number; and a wiring line formed in a pattern on said back board of said extension shelf for interconnecting each identification number setting connector of said extension circuit cards so that, when any one of said extension circuit cards is mounted on said back board of said extension shelf, only the identification number setting connector provided on the extension circuit card, said digit value setting circuit and said wiring line are used independently of said basic shelf so as to cooperate with one another to form a plurality of switches, each being individually in one of an on and off state to automatically set an identification number of the extension circuit card in accordance with the on/off states of the switches.

9. A circuit card mounting shelf apparatus having an automatic identification number setting function as claimed in claim 8, wherein the identification numbers of said extension circuit cards are automatically set in the form of binary information.

10. A circuit card mounting shelf apparatus having an automatic identification number setting function as claimed in claim 8, wherein said digit value setting circuit is constructed as a short circuit for realizing an on state of one of the switches of the interface card.

11. A circuit card mounting shelf apparatus having an automatic identification number setting function as claimed in claim 8, wherein said digit value setting circuit is constructed as a circuit for fixedly setting a value of the uppermost bit of an identification number represented in binary notation.

\* \* \* \* \*